United States Patent [19]

Homma et al.

[11] Patent Number: 4,766,313
[45] Date of Patent: Aug. 23, 1988

[54] APPARATUS FOR QUANTITATIVE SECONDARY ION MASS SPECTROMETRY

[75] Inventors: Yoshikazu Homma; Yoshikazu Ishii, both of Tokyo, Japan

[73] Assignee: Nippon Telegraph & Telephone Public Corporation, Tokyo, Japan

[21] Appl. No.: 20,181

[22] Filed: Feb. 26, 1987

Related U.S. Application Data

[63] Continuation of Ser. No. 713,308, Mar. 18, 1985.

[30] Foreign Application Priority Data

Mar. 22, 1984 [JP]  Japan .................................. 59-53462
Jul. 6, 1984 [JP]  Japan ................................ 59-140241

[51] Int. Cl.$^4$ ............................................ H01J 49/24
[52] U.S. Cl. ..................................... 250/289; 250/309; 250/443.1; 62/514 R
[58] Field of Search ...................... 250/289, 309, 443.1; 62/55.5, 514 R

[56] References Cited

U.S. PATENT DOCUMENTS 3,798,447  3/1974  Lanusse et al. ...................... 250/309
4,179,605  12/1979  Watanabe et al. ................... 250/311

OTHER PUBLICATIONS

European Search Report.
International Journal of Mass Spectrometry and Ion Physics, vol. 7, 1971, pp. 111–120.
Journal of Physics E., vol. 11, No. 5, May 1978, pp. 441–448.
Instruments and Experimental Techniques, vol. 28, No. 1, Part 2, Jan.–Feb. 1985, pp. 220–223.
Journal of Vacuum Science & Technology A, vol. 3, No. 2, Mar.–Apr. 1985, pp. 356–360.

Primary Examiner—Bruce C. Anderson
Assistant Examiner—Jack I. Berman
Attorney, Agent, or Firm—Frishauf, Holtz, Goodman & Woodward

[57] ABSTRACT

An apparatus for quantitative secondary ion mass spectrometry comprising a sealed chamber for storing a sample containing a light impurity element which is to be analyzed, secondary ion generating means for bombarding a primary ion beam onto the sample so as to allow the sample to emit a secondary ion of the light element, and quantitative analyzing means for detecting the secondary ion so as to quantitatively analyze the light element contained in the sample. First evacuating means evacuates said sealed chamber to an ultrahigh vacuum during quantitative analysis. First cryopanel means is arranged to surround the sample, and first cooling means keeps said first cryopanel means at a cryogenic temperature during quantitative analysis so that said first cryopanel means adsorbs a gas present in said sealed chamber.

12 Claims, 6 Drawing Sheets

PRIOR ART

F I G. 2
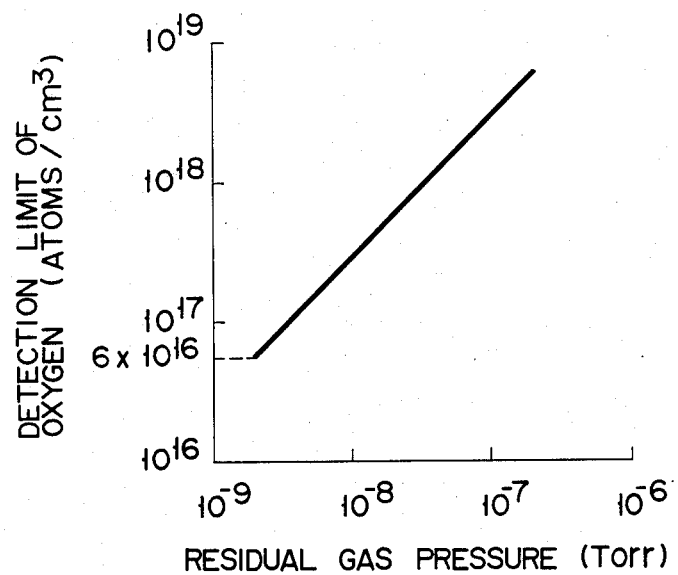
F I G. 5
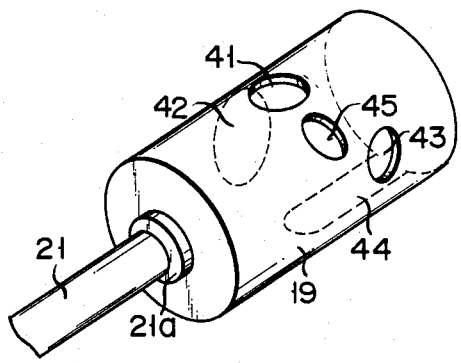

F I G. 8
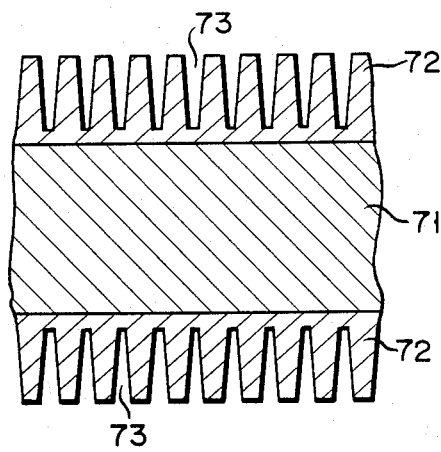
F I G. 9
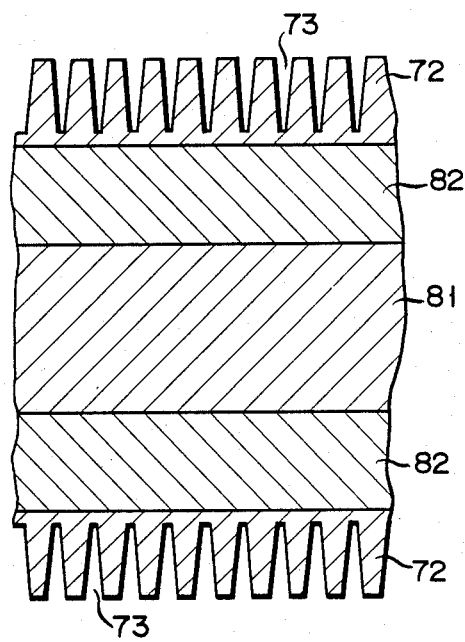

APPARATUS FOR QUANTITATIVE SECONDARY ION MASS SPECTROMETRY

This application is a continuation, of application Ser. No. 713,308, filed Mar. 18, 1985.

BACKGROUND OF THE INVENTION

1. Field of the Invention

The present invention relates to an apparatus for quantitative secondary ion mass spectrometry and, more particularly, to such an apparatus suitable for use in quantitatively analyzing trace amounts of light elements contained in a material.

2. Description of the Prior Art

An apparatus for quantitatively analyzing secondary ions using a mass spectrometer is known wherein ion (primary ion) beams such as argon, cesium or the like bombard a material, e.g., a metal material or a semiconductor material placed in a sealed chamber kept under vacuum so as to allow it to emit elements contained in the material as ions (secondary ions) and to quantitatively analyze the emitted secondary ions (see R. E. Honig: Advances in Mass Spectrometry, edited by A. R. West, Applied Science Publishers, Barking, 1974, p.337). In an apparatus for quantitative secondary ion mass spectrometry of this type, when trace amounts of a light element contained in a sample such as hydrogen, carbon, nitrogen, oxygen, silicon, sulfur and the like are analyzed, the interior of the sealed chamber, particularly, a surrounding portion of the sample to be analyzed placed in the sealed chamber must be kept at an ultrahigh vacuum so as to reduce background light elements which are contained in the residual gases in the vacuum.

However, in a conventional apparatus, the overall sealed chamber is evacuated simply by an ion pump or a cryopump. For this reason, the interior of the sealed chamber cannot fully be evacuated, and residual gases undesirably remain therein. In addition, contaminating gases are released from the surface of the sample, and contaminating gases can also be introduced into the sealed chamber from a primary ion source. A pressure in the sealed chamber, particularly at the surrounding portion of the sample, is increased by these gas components, and light elements as major components of these gases cannot be prevented from sticking in the surface of the sample. FIG. 1 shows a conventional apparatus provided with a cryopump. The apparatus includes a sealed chamber 1 which is provided with the cryopump 7 at its one end. The cryopump 7 is constituted by a refrigerator 7a, a cryopanel 7b, an outer cryopanel (or shield panel) 7c and a baffle 7d. The sealed chamber 1 holds therein a sample holder 4 on which a sample S is to be placed, an electrostatic lens 5 and a deflection electrode 6. A pipe is connected to the chamber 1 and provides a passageway for a primary ion beam 3 generated from a primary ion source (not shown). Only the cryopump cannot fully evacuate the chamber 1. Further, even if an ion pump 8 is provided for the chamber 1, a surrounding portion of the sample S cannot be fully evacuated. When the light elements are analyzed in such a state, a detection limit of a target light element is limited by the residual gas pressure near the sample, and light elements contained in a sample in trace amounts cannot be analyzed. For example, FIG. 2 shows an analytical result of the oxygen detection limit when the present inventors quantitatively analyzed an impurity oxygen contained in a gallium arsenide (GaAs) crystal using the conventional apparatus. As is apparent from FIG. 2, in the conventional apparatus, the detection limit of oxygen is on the order of $10^{16}/cm^3$. Since an impurity oxygen concentration in the high purity GaAs crystal is on the order of $10^{15}/cm^3$ or less, such a low impurity concentration cannot be analyzed by the conventional apparatus.

SUMMARY OF THE INVENTION

It is therefore an object of the present invention to provide an apparatus for quantitative secondary ion mass spectrometry in which background light elements which are present in a sealed chamber, particularly near a sample, can be evacuated so that trace amounts of light impurity elements can be precisely analyzed.

In order to achieve the above object, there is provided an apparatus for quantitative secondary ion mass spectrometry comprising: a sealed chamber for storing a sample containing a light impurity element which is to be analyzed, means for bombarding a primary ion beam onto the sample so as to allow the sample to emit a secondary ion beam of the light element, quantitative analyzing means for detecting the secondary ion beam so as to quantitatively analyze the light element contained in the sample, evacuating means for evacuating the sealed chamber to an ultrahigh vacuum during quantitative analysis, cryopanel means arranged to surround the sample, and cooling means for keeping the cryopanel means at a cryogenic temperature during quantitative analysis so that the cryopanel means adsorbs gases present in the sealed chamber.

Primary ion beams are normally irradiated from a primary ion source into the sealed chamber through a sealed path.

In an aspect of the present invention, in order to prevent undesirable gases from being introduced into the sealed chamber from the primary ion source, at least one evacuation means is provided for a primary ion beam path so as to keep the path at an ultrahigh vacuum.

In a second aspect of the present invention, in order to evacuate the sealed chamber, at least two pumps are provided, and the sample is placed in a common evacuation region of the two pumps.

BRIEF DESCRIPTION OF THE DRAWINGS

FIG. 2 is a graph showing a detection limit of oxygen when the oxygen in a GaAs sample is quantitatively analyzed using the conventional apparatus;

FIG. 5 is a perspective view of a cryopanel surrounding a sample in the apparatus of the present invention;

FIGS. 8 and 9 are respectively sectional views for explaining a material of the cryopanel used in the quantitative secondary ion mass spectrometer of the present invention.

DETAILED DESCRIPTION OF THE PREFERRED EMBODIMENTS

Figure 1:
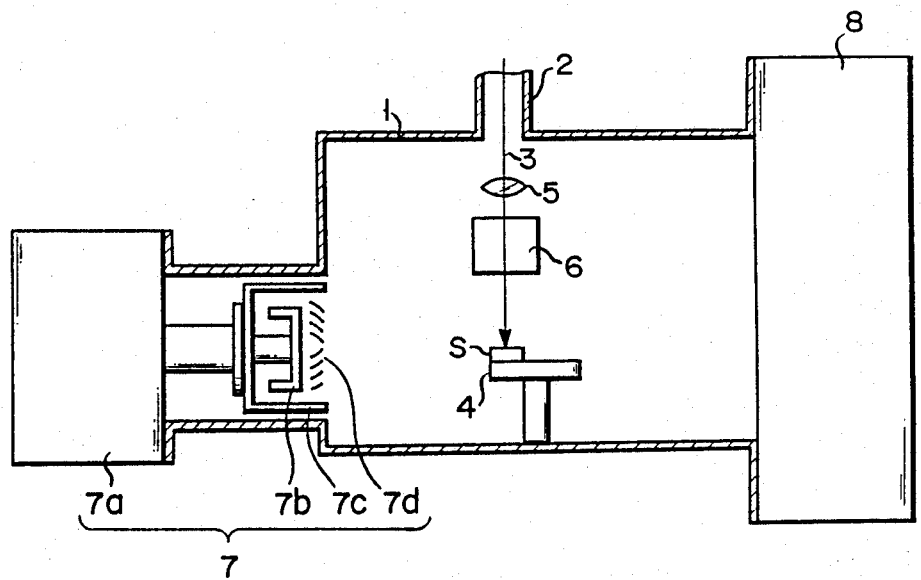
FIG. 1 shows a conventional apparatus for quantitative secondary ion mass spectrometry.

The present invention will be described hereinafter with reference to the accompanying drawings. Note that in the drawings, the same reference numerals denote the same parts.

Figure 3:
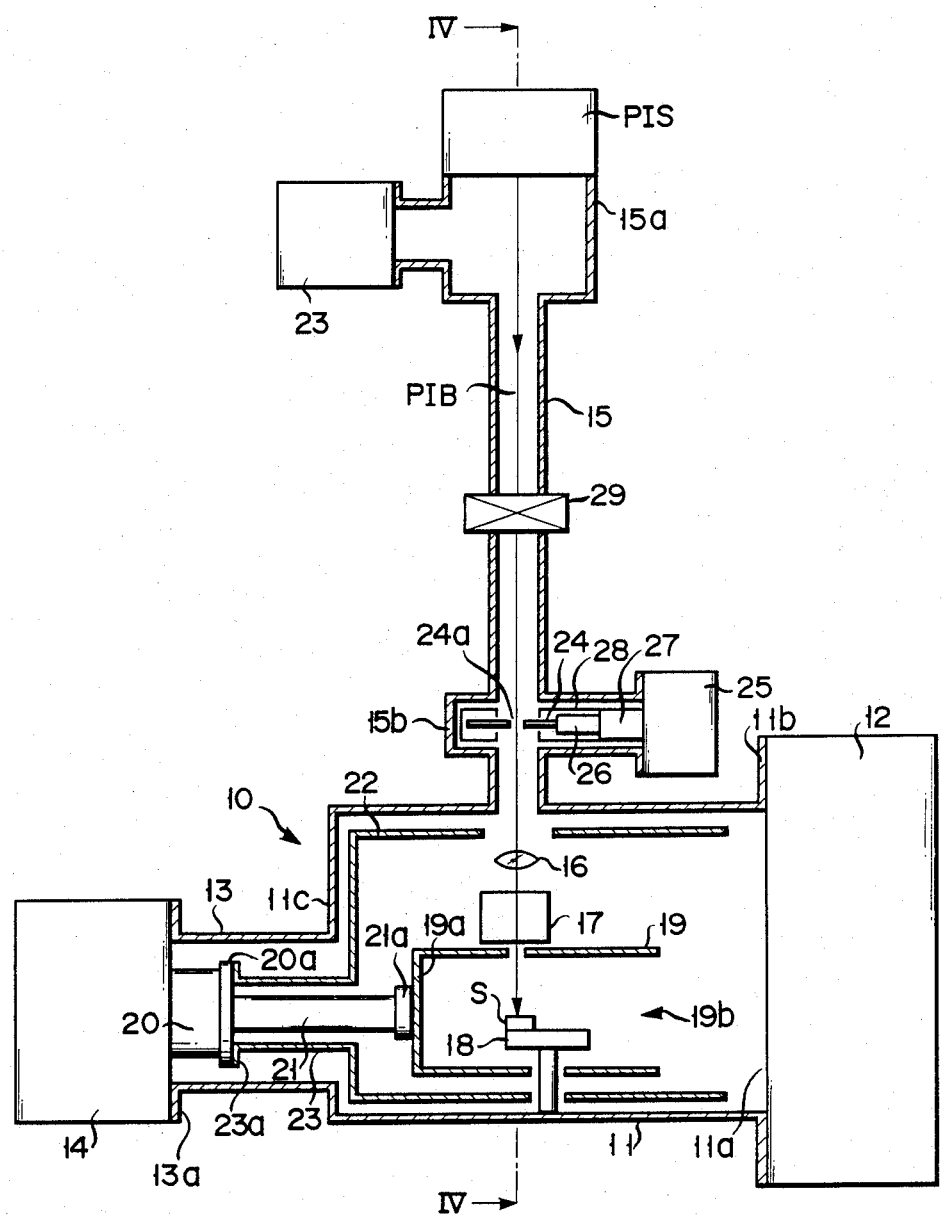
FIG. 3 is a sectional view of an apparatus for quantitative secondary ion mass spectrometry according to the present invention.

FIG. 3 shows an example of an apparatus for quantitative secondary ion mass spectrometry of the present invention. The apparatus 10 comprises a cylindrical chamber body 11 made of a material (e.g., stainless steel) which can withstand a high baking temperature of, e.g., 250° C. or more. A flange portion 11b at an open end portion 11a of the chamber body 11 is connected to an ultrahigh vacuum evacuation pump, e.g., an ion pump 12. An ion pump evacuates the interior of the chamber body 11 to an ultrahigh vacuum in the following manner. Electrons generated upon application of a high voltage and helically moving in a high-intensity magnetic field ionize gas molecules so as to cause them to be attracted to a cathode or to propell them by electrodes into an auxiliary pump or ion trap. A pump of this type is well known to those skilled in the art.

A hollow cylinder 13 is provided at a closed end portion 11c of the chamber body 11 opposite to the end portion 11a. The cylinder 13 communicates with the interior of the chamber body 11 and has a diameter smaller than that of the chamber body 11. A refrigeration unit, e.g., a helium refrigeration unit 14 for cooling the wall of a cryopanel 19 (described later) to a cryogenic temperature is connected to a flange portion 13a of the cylinder 13. The unit 14 includes a thermally conductive rod 20. In operation, the cryopanel 19 which is cooled to a cryogenic temperature of, e.g., 30 K or less by the refrigeration unit 14 serves as a cryopump, so that gases are adsorbed by the surface of the cryopanel 19 so as to evacuate the interior thereof to an ultrahigh vacuum at high pumping speed. The unit 14 is preferably made of a material which can withstand a high baking temperature of, e.g., 250° C. or more.

The chamber body 11 is sealed by the ion pump 12 and the refrigeration unit 14, and thus provides a sealed chamber.

A cylindrical elongated pipe 15 of stainless steel is vertically provided on a circumferential surface of the chamber body 11. The pipe 15 communicates with the interior of the chamber body 11. An open end portion of the pipe 15 is connected to a primary ion source PIS, e.g., an ion source of argon, cesium or the like for generating primary ion beams PIB. The primary ions from the ion source PIS bombard a sample S (to be described later) through an electrostatic lens 16 and a deflection electrode 17 provided in the chamber body 11 via the pipe 15.

The sample S to be analyzed for light elements is placed on a sample holder 18 provided in the chamber body 11. The cryopanel 19 is in the form of a hollow cylinder with a bottom and is provided so as to surround the sample S. A closed end portion 19a of the cryopanel 19 is thermally connected to the refrigeration unit 14 through a cold head 21a of a thermally conductive rod 21 which is connected to a cold head 20a of the refrigeration unit 14. On the other hand, an open end portion 19b of the cryopanel 19 opposes the ion pump 12, so an evacuation conductance of the pump 12 is not degraded. When the cryopanel is so arranged, the sample S within the cryopanel 19 is positioned within a common evacuation region of the ion pump 12 and the cryopump so that a pressure around the sample S can be further decreased.

The cryopanel 19 cooled to 30 K or less, preferably to 20 K or less by the refrigeration unit 14 effectively adsorbs gas molecules introduced into the chamber body 11 from the ion source PIS together with primary ion beams PIB and gas molecules released from the surface of the sample S so as to keep the portion surrounding the sample S under the ultrahigh vacuum.

As shown in FIG. 5, the cryopanel 19 is provided with an inlet port 41 for the primary ion beams PIB, a detection port 42 for detecting the secondary ions emitted from the sample sputtered by the primary ion beams PIB, a sample S insertion port 43, a notch 44 for the sample holder 18, and an observation window opening 45.

A hollow cylindrical shield panel 22 with a bottom is provided between the chamber body 11 and the cryopanel 19. The panel 22 has a diameter slightly smaller than that of the chamber body 11. A flange portion 23a of a hollow cylinder 23 is provided at a closed end portion of the panel 22 so as to communicate with the interior of the chamber body 11. The shield panel 22 is connected to the cold head 20a at the flange portion 23a. The shield panel 22 is cooled by the refrigeration unit 14 to an intermediate temperature (e.g., 77 K) between a room temperature and a temperature to which the cryopanel 19 is cooled. If the panel 22 is not provided, the object of this invention can still be achieved. However, if provided, heat from the chamber body 11 usually placed at room temperature is prevented from directly radiating to the cryopanel 19, thus reducing a heat load on the cryopanel 19. Therefore, the refrigeration unit 14 can be of a low-power type.

Figure 4:
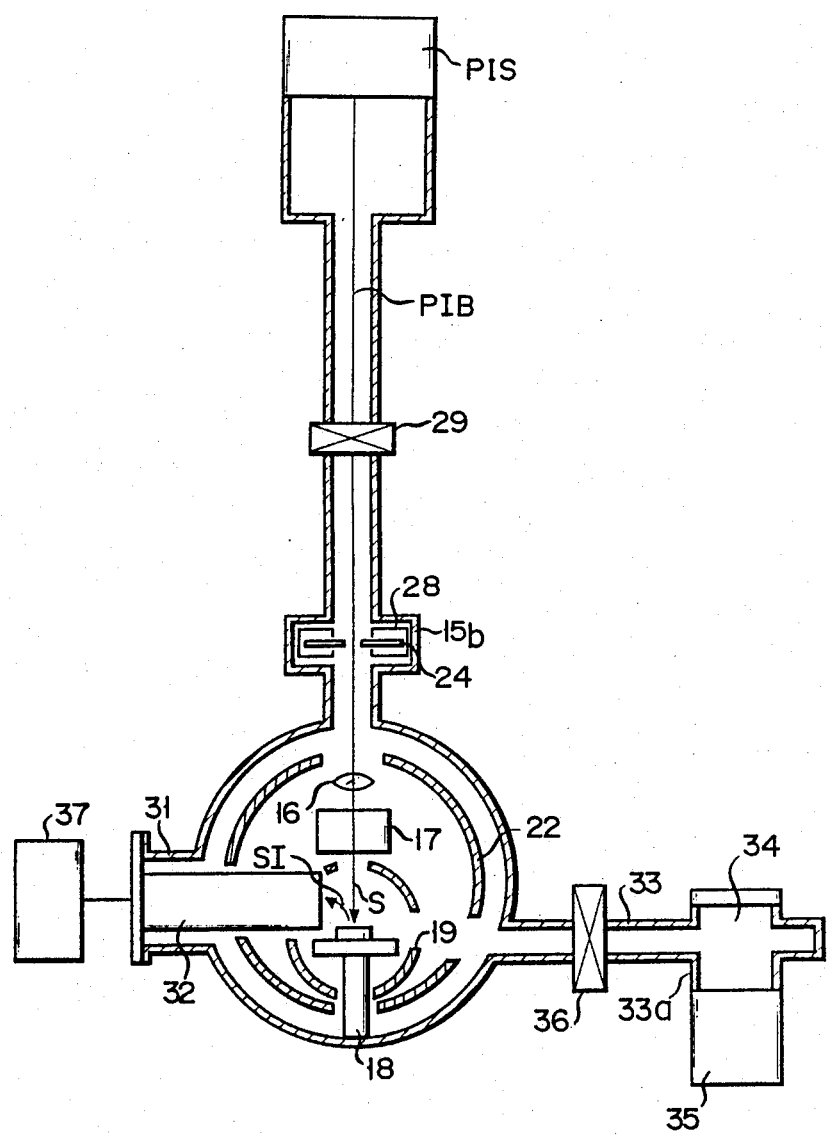
FIG. 4 is a sectional view taken along the line IV—IV of FIG. 3.

Referring to FIG. 4, a detector (mass spectrometer) 32 (known per se) for detecting secondary ions SI and converting them to electron pulses is provided in the chamber body 11 so as to oppose the secondary ion detection port 42 of the cryopanel 19 through a hollow cylinder 31 which is formed on the circumferential surface of the chamber body 11 so as to extend in a direction perpendicular to the pipe 15. The detector 32 is connected to a system 37 to count and process the pulses and display the results outside the chamber body 11.

An annular pipe 33 which has one closed end is provided on the circumferential surface of the chamber body 11 opposite to the cylinder 31. A portion near a closed end portion 33a of the pipe 33 is expanded so as to constitute a preevacuation chamber 34. A metal gate valve 36 in the pipe 33 is provided between the chamber 34 and the chamber body 11.

Referring again to FIG. 3, the pipe 15 defining the path of the primary ion beams PIB has an enlarged-diameter portion 15a connected to the ion source PIS. The portion 15a is connected to a vacuum pump 23 such as a cryopump, ion pump or turbo molecular pump (preferably a turbo molecular pump) so as to exhaust the gases from the ion source PIS.

The pipe 15 has another enlarged-diameter portion 15b relatively near the chamber body 11. A disk-shaped cryopanel 24 having a small central through hole 24a for transmitting the primary ion beams PIB is coaxially provided in the portion 15b. The cryopanel 24 is connected to a refrigeration unit 25 similar to the bakable refrigeration unit 14 through thermally conductive rods 26 and 27. A hollow annular shield panel 28 is arranged so as to surround the cryopanel 24. The shield panel 28 is connected to the rod 27 of the refrigeration unit 25. The shield panel 28 functions the same as the shield panel 22. The central portion of the cryopanel 24 is not covered by the shield panel 28 and is exposed to the gas flow from the primary ion source PIS.

A metal gate valve 29 is provided between the portions 15a and 15b of the pipe 15.

In order to analyze light elements contained in the sample S using the above apparatus 10, the gate valves 29 and 36 are opened, and the vaccum pumps 23 and 35 are driven with the ion pump 12 and the refrigeration unit 14 deactivated. Thus, the overall apparatus is baked at a temperature of 250° C. or more, preferably, while the pressure in the apparatus is reduced to $10^{-8}$ to $10^{-9}$ Torr. Since the refrigerators 14 and 25 are of a bakable type and gate valves 29 and 36 are made of a heat-resistant metal as described above, baking can be performed without any problem. With this baking process, water content and gas components attached to or absorbed in the inner wall of the apparatus can be released and are exhausted by the vacuum pumps 23 and 35. After baking, the gate valves 29 and 36 are closed, the ion pump 12 and the refrigeration unit 14 are driven so as to evacuate the interior of the chamber body 11 to an ultrahigh vacuum, and the refrigeration unit 25 is driven to cool the cryopanel 24 to a cryogenic temperature. Thereafter, the sample S is introduced into the preevacuation chamber 34 and the chamber 34 is evacuated by the vacuum pump 35. Then, the gate valve is opened, the sample S is placed at a predetermined position on the sample holder 18, and the gate valve 36 is closed.

After the above operations, the gate valve 29 is opened, and the primary ion beams PIB irradiate the sample S from the primary ion source PIS through the through hole 24a of the cryopanel 24, the electrostatic lens 16, the deflection electrode 17 and the through hole 41 of the cryopanel 19. The secondary ions SI emitted from the sample S by bombarding of the primary ion beams PIB are subjected to analysis by the mass spectrometer, and the light elements contained therein are thus analyzed. During analysis, if the ion source PIS is evacuated only by the vacuum pump 23, contaminating gas components generated from the ion source PIS cannot be prevented from flowing into the chamber body 11. In other words, since the pressure of the ion source PIS is $1\times10^{-6}$ Torr, gas flow in the pipe 15 is turned into molecule flow, and gas molecules freely move in the vacuum. In this state, even when the evacuation is performed by the vacuum pump 23, only gas molecules which are introduced through the port of the vacuum pump 23 are evacuated. However, when the cryopanel 24 is further provided downstream to the vacuum pump 23, contaminating gas molecules which are not evacuated by the vacuum pump 23 can be trapped by the cryopanel 24. Therefore, only few contaminating gas molecules can be introduced into the chamber body 11. The cryopanel 19 is provided so as to surround the sample S placed in the chamber body 11. For this reason, if contaminating gases are introduced from the ion source PIS or if gases are released from the surface of the sample S, since the cryopanel 19 effectively traps these gases, the portion surrounding the sample S can be effectively evacuated. Therefore, light elements in the chamber body vacuum which adversely influence analysis can be substantially eliminated. When the apparatus of the present invention is used, light elements, such as hydrogen, carbon, nitrogen, oxygen, silicon, sulfur, and the like, contained in trace amounts in a material, e.g., a metallic material and a semiconductor material can be precisely quantitatively analyzed.

In the embodiment shown in FIGS. 3 and 4, the ion pump and the cryopump are preferably arranged opposite to each other; they can also be arranged perpendicularly to each other.

Figure 6:
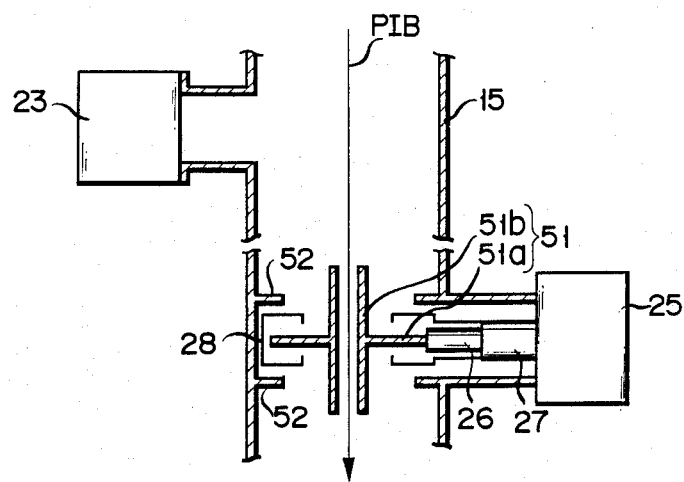
FIGS. 6 and 7 are sectional views respectively showing different evacuation systems used for evacuating a primary ion beam path in the apparatus of the present invention.

In the embodiment shown in FIGS. 3 and 4, a two-stage differential evacuation system at the primary ion source side comprises the vacuum pump 23 and the disk-shaped cryopanel 24 cooled by the refrigeration unit 25. The two-stage evacuation system, particularly the cryopanel, is not limited thereto. FIG. 6 shows another two-stage evacuation system. In this evacuation system, a cryopanel 51 provided near the vacuum pump 23 comprises a disk plate 51a and a hollow cylinder 51b extending through a central portion of the plate 51a. Primary ion beams PIB pass through the cylinder 51b. The inner diameter of the cylinder 51b is preferably decreased to that which does not prevent the primary ion beams from passing therethrough. A shield panel 28 is provided so as to surround the disk plate 51a of the cryopanel 51. The disk plate 51a of the cryopanel 51 is thermally connected to the refrigeration unit 25. Gas molecules introduced into the housing 11 passing through the cryopanel 51 are limited to those passing through the narrow cylinder 51b. Other gas molecules are trapped by the surface of the cryopanel 51 or the shield panel 28, or reflected by a buffer plate 52 and evacuated by the vacuum pump 23. When the cryopanel 51 is used, the amount of gas molecules from the ion source PIS is reduced to 1/10 to 1/20 that when the apparatus shown in FIGS. 3 and 4 is used. The buffer plate 52 can be used in the apparatus shown in FIGS. 3 and 4.

Figure 7:
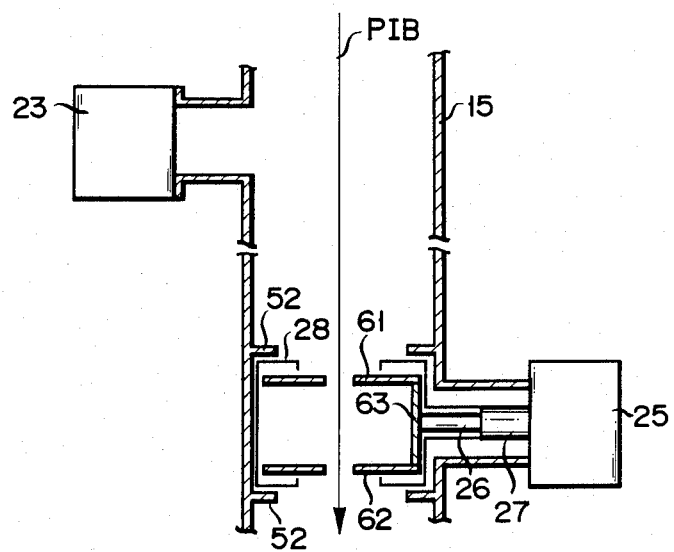

FIG. 7 shows still another example of the two-stage evacuation system. In this evacuation system, a cryopanel means comprises two disk plates 61 and 62 each having a through hole formed in its central portion and spaced from each other. These disk plates are supported by a support plate 63 which is connected to a rod 26 of a refrigeration unit 25. The cryopanel means has the same effect as that of the cryopanel 51 shown in FIG. 5.

In the apparatus described above, the cryopanel can be formed of aluminum, oxygen free copper, nickel plated oxygen-free copper and the like. However, as shown in FIG. 8, a substrate 71 made of an aluminum-based metallic material, i.e., aluminum or aluminum alloy which is subjected to anodic oxidation so as to form porous anodic oxide films 72 (enlarged in FIG. 7) on two surfaces thereof is preferably used. Each anodic oxide film 72 has a number of pores 73 which extend substantially vertically to the surface of the substrate 71. Diameters and density of the pores 73 depend upon a temperature and a concentration of an electrolytic solution and a current density. Normally, each pore has a diameter of about 10 nm to 30 nm, and a density thereof is about $10^{10}$ to $10^{11}/cm^2$. For example, when anodic oxidation is performed at a voltage of 15 V, a temperature of 20° C., and a current density of 1 A/dm$^2$ using the sulfate electrolytic solution of a 15% concentration, the anodic oxide film of a pore diameter of 16 nm and a density of $8\times10^{10}/cm^2$ is obtained. In this manner, since the anodic oxide, film is porous, a surface area thereof is considerably larger than that of a flat panel.

In the cryopanel, when an arrival rate of gases from the vacuum to the surface thereof is constant, a surface covering ratio of trapped gas molecules decreases proportionally to a reciprocal number of its surface area.

Therefore, when the cryopanel is formed of an aluminum-based metallic material on which a porous oxide film is formed by anodic oxidation, an increase in an amount of gases trapped due to an increase in surface area can be, e.g, 400 times the amount trapped by the cryopanel having the flat surface. The cryopanel having the anodic oxide film can trap even helium, hydrogen, and neon. In addition, since the anodic oxide film has good mechanical strength and thermal stability, even if it is greatly vibrated or subjected to a repeated heat cycle, it will not peel. The thickness of the anodic oxide film can be 10 to several tens of micrometers. However, the film is preferably set to be thick enough to increase an effective trapping area.

FIG. 9 shows another example of the cryopanel having the anodic oxide film. The cryopanel is formed in such a manner that alumimum-based metallic materials 82 are cladded on two surfaces of an oxygen free copper substrate 81 and are subjected to anodic oxidation in the same manner as described above so as to form porous anodic oxide films 72. Since copper has a better thermal conductivity than aluminum, this cryopanel is more easily cooled.

Note that the shield panels 22 and 28 can be formed of the same material as that of the cryopanel.

Table 1 below shows vacuum pressures in a chamber and detection limits of various light elements contained in GaAs of the conventional apparatus having no cryopanels 19 and 24 and the apparatuses I and II of the present invention. The apparatus I is the same as the conventional one except that a cryopanel is provided to surround the sample as shown in FIGS. 3 and 4. The apparatus II is as shown in FIGS. 3 and 4. Note that the cryopanel was cooled to a temperature of 20 K, and the vacuum pressure mentioned in Table 1 is a pressure within the overall chamber.

TABLE 1

| Item | | Conventional apparatus | Apparatus I of present invention | Apparatus II of present invention |
|---|---|---|---|---|
| Vacuum pressure (Torr) | | $2 \times 10^{-9}$ | $7 \times 10^{-10}$ | $1 \times 10^{-11}$ or less |
| Vacuum pressure during analysis (Torr) | | $3 \times 10^{-9}$ | $9 \times 10^{-10}$ | $5 \times 10^{-11}$ |
| Detection limits of light elements in GaAs (atoms/cm$^3$) | C | $2 \times 10^{16}$ | $5 \times 10^{15}$ | $2 \times 10^{14}$ |
| | O | $6 \times 10^{16}$ | $7 \times 10^{15}$ | $4 \times 10^{14}$ |
| | Si | $5 \times 10^{14}$ | $1 \times 10^{14}$ | $2 \times 10^{13}$ |
| | S | $2 \times 10^{15}$ | $5 \times 10^{14}$ | $1 \times 10^{13}$ |

Table 1 shows that the detection limits of the apparatus of the invention are improved due to decrease in the pressure around the sample and that the pressure in the overall chamber is also decreased with the apparatus of the invention. An effect with respect to the detection limits of light elements is considerable with oxygen (O) and carbon (C). In addition, as is apparent from Table 1, the detection limits with respect to silicon (Si) having the same mass number as that of carbon oxide (CO) and sulfur (S) having the same mass number as that of oxygen molecule ($O_2$) can be lowered to 1/5 or 1/20 level. The cooling temperature of the cryopanel 19 is most effective when it is as low as possible, preferably, 20 K or lower. Even when the cooling temperature is 30 K or slightly higher, the detection limits could be improved.

As described above, in the apparatus for quantitative secondary ion mass spectrometry according to the present invention, since light element components of residual gases in the vacuum surrounding a sample to be analyzed can be effectively evacuated by a cryopanel, background light elements preset during analysis can be greatly reduced. Therefore, when the apparatus of the present invention is used particularly for analysis of a high purity semiconductor material, quantitative analysis of trace amounts of light elements in the semiconductor material and evaluation of concentration distribution therein can be performed. This allows high quality of a semiconductor crystal and a semiconductor integrated circuit.

What is claimed is:

1. An apparatus for quantitative secondary ion mass spectrometry comprising:
   a sealed chamber for storing a sample containing a light impurity element which is to be analyzed;
   secondary ion generating means for bombarding a emit a secondary ion of the light element;
   quantitative analyzing means for detecting the secondary ion so as to quantitatively analyze the light element contained in the sample; and
   means for producing an ultrahigh vacuum of at least $10^{-10}$ Torr during quantitative analysis including first evacutating means for evacuating said sealed chamber having first and second vacuum pumps respectively connected to said sealed chamber and opposed relative to each other, said first vacuum pump comprising a first cryopanel means arranged to surround the sample in spaced relationship therefrom and including a first cylinder with a bottom and an opposed opening, a second cryopanel means arranged to surround the first cryopanel means and including a second cylinder with a bottom and an opposed opening, the openings of said first and second cylinders arranged to oppose said second pump, and first cooling means for keeping said first and second cryopanel means at a cryogenic temperature during quantitative analysis so that said first and second cryopanel means adsorb a gas present in said sealed chamber.

2. An apparatus according to claim 1, wherein said second vacuum pump is an ion pump.

3. An apparatus according to claim 1, wherein said first cooling means cools said first cryopanel means to a cryogenic temperature of not more than 30 K.

4. An apparatus according to claim 1, wherein said secondary ion generating means comprises a primary ion source provided outside said sealed chamber and a sealed path which communicates with said sealed chamber to allow the primary ion from said primary ion source to pass toward the sample, and further comprising second evacuating means, connected to said sealed path, for evacuating said sealed path to the ultrahigh vacuum pressure.

5. An apparatus according to claim 4, wherein said second evacuating means comprises a vacuum pump and cryopump means provided downstream thereof.

6. An apparatus according to claim 5, wherein said cryopump means is provided so as to cross said sealed path, and comprises third cryopanel means having a through hole at a central portion thereof through which the primary ion beam passes and second cooling means for cooling said second cryopanel means to the cryogenic temperature, wherein the second cooling means is bakable.

7. An apparatus according to claim 6, wherein said third cryopanel means comprises at least one disk plate.

8. An apparatus according to claim 6, wherein said second cryopanel means comprises a disk plate and a hollow cylinder extending through a central portion of said disk plate.

9. An apparatus according to claim 1, wherein said first cryopanel means comprises a material having an aluminum porous anodic oxide film formed on a surface thereof.

10. An apparatus according to claim 9, wherein the material of said first cryopanel means comprises a substrate of an aluminum-based metallic material and aluminum anodic oxide films formed on two surfaces of said substrate.

11. An apparatus according to claim 9, wherein the material of said first cryopanel means comprises a substrate of copper and aluminum anodic oxide films formed on two surfaces of said substrate.

12. An apparatus according to claim 1, wherein the first cooling means is bakable.

* * * * *